(12) United States Patent
Sato et al.

(10) Patent No.: US 6,201,298 B1
(45) Date of Patent: Mar. 13, 2001

(54) SEMICONDUCTOR DEVICE USING WIRING TAPE

(75) Inventors: Ryoji Sato; Masanori Takeuchi; Keiichiro Kata, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/301,176

(22) Filed: Apr. 28, 1999

(30) Foreign Application Priority Data

Apr. 28, 1998 (JP) .................................................. 10-119482

(51) Int. Cl.[7] .................................................. H01L 23/52
(52) U.S. Cl. .......................... 257/691; 257/692; 257/695; 257/780; 257/668; 257/680; 257/675
(58) Field of Search ..................................... 257/668, 780, 257/675, 691, 692, 695, 680, 782, 783

(56) References Cited

U.S. PATENT DOCUMENTS 5,776,796 * 7/1998 Distefano et al. ..................... 438/106

FOREIGN PATENT DOCUMENTS

| 9-55447 | 2/1997 | (JP) . |
| 409055447 * | 2/1997 | (JP) . |
| 10-256420 | 9/1998 | (JP) . |

* cited by examiner

Primary Examiner—Steven Loke
Assistant Examiner—Luan Thai
(74) Attorney, Agent, or Firm—Hutchins, Wheeler & Dittmar

(57) ABSTRACT

A printed circuit board is connected to a single-layer wiring tape so as to surround an integrated circuit element which is connected to the single-layer wiring tape. Wiring patterns of the wiring tape are formed from either a power electrode or a ground electrode on the integrated circuit element to a planar metal pattern on the printed circuit board, from the planar metal pattern on the printed circuit board to either an external power terminal or an external ground terminal on the wiring tape, and from a signal electrode on the integrated circuit element to an external signal terminal on the wiring tape.

12 Claims, 9 Drawing Sheets

SEMICONDUCTOR DEVICE USING WIRING TAPE

BACKGROUND OF THE INVENTION

1. Field of the Invention

The present invention relates to a semiconductor device utilizing a wiring tape, such as BGA (Ball Grid Array) or CSP (Chip Size Package).

2. Description of the Related Art

In recent years, there have been growing demands for the increased number of pins and a miniaturization with regard to semiconductor devices. To meet the demand, there have been proposed semiconductor devices called BGA or CSP. An example of such a semiconductor device is disclosed in Japanese Patent Laid-Open No. 55447/1997.

FIGS. 1A to 1C show the disclosed semiconductor device, FIG. 1A is a vertical sectional view taken along a line C–C' of FIG. 1B, FIG. 1B is a horizontal sectional view taken along a line A–A' of FIG. 1A, and FIG. 1C is a horizontal sectional view taken along a line B–B' of FIG. 1A.

As shown in FIGS. 1A to 1C, the disclosed semiconductor device has a construction that an electrode 101a of semiconductor integrated circuit element (hereinafter referred to as chip) 101 is connected to an inner lead 102f extending inside a frame portion of a TAB tape 102, which in turn is adhered to a metallic support frame 107, and chip 101, both oh which are covered with a potting resins 106. TAB tape 102 has a circuit pattern 102a and inner lead 102f which are formed by etching metallic foil adhered onto a base substrate (e.g., polyimide tape) 102c of a frame configuration. Circuit pattern 102a is covered with a cover resist 102e except a portion to be connected with an external terminal 104.

In the above structure, the provision of a through hole for the connection between external terminal 104 and a support frame 107 in the frame portion of TAB tape 102, will endow support frame 107 with a GND plane (ground plane) function.

Another semiconductor device such as shown in each of FIGS. 2A to 2C has been proposed. FIG. 2A is a vertical sectional view taken along a line C–C' of FIG. 2B, FIG. 2B is a horizontal sectional view taken along a line A–A' of FIG. 2A, and FIG. 2C is a horizontal sectional view taken along a line B–B'.

The semiconductor device comprises a chip 201, a single-layer wiring tape 202 and a molding resin 203 for maintaining an outer shape of the device. Chip 201 includes an internal electrode 201a which is connected to an external terminal (e.g., solder ball) 204, via through hole 202b in a base substrate 202c of a wiring tape 202, and a circuit pattern 202a on base substrate 202c. Circuit pattern 202a is covered with a cover resist 202e except a portion to be connected with external terminal 204 and a portion forming through hole 202b. Electrode 201a on chip 201 and through hole 202b of wiring tape 202 are connected to each other by a bump. This connecting method is called an inner bump bonding (IBB) method. Wiring tape 202 and chip 201 are closely bonded to each other with an adhesive material 202d provided in wiring tape 202 by employing a hot pressing method. Chip 201 is covered by a molding resin 203 which is formed by employing a transfer molding method.

Unlike the semiconductor device described in the foregoing publication which uses TAB tape, the above structure enables external terminals to be arranged even on an area occupied by the chip, thus making a length of a wiring pattern for the connecting between the internal electrode and the external terminal shorter. This result in improved electrical characteristics as well as improved characteristics of radiating heat to a mounted substrate. In addition, unlike the inner lead of TAB tape, the external terminals can be freely arranged.

An approach to improve electrical characteristics such as noise reduction in the semiconductor device shown in FIGS. 2A to 2C, is that GND plane or power plane is provided on an outer periphery of base substrate 202c of wiring tape 202, and a wiring pattern is provided from a ground electrode on chip 201 to the GND plane(or from a power electrode on the chip to the power plane), passing between pads to be connected with the external signal terminal.

However, a further increase in the number of pins causes a pitch between the pads to be connected with the external signal terminal to be smaller. Thus, there is a limit on the number of wiring patterns which can be passed between the pads, making it difficult to provide the wiring pattern for GND and the wiring pattern for a power source between the pads. Namely, when the number of pins further increases, improvement of electrical characteristics such as noise reduction may be impossible.

An approach to address the above problem may involve a multilayer structure of a wiring tape, that is, a signal layer, a GND layer, and a power layer. This approach is, however, disadvantageous in that a multilayered wiring tape is costly, and hence reducing the cost of products may be impossible.

SUMMARY OF THE INVENTION

It is an object of the present invention to provide a semiconductor device capable of reinforcing a GND line or a power line and also capable improving a signal characteristics while utilizing a less expensive single-layer wiring tape.

It is an another object of the present invention to provide a semiconductor device adaptable to the increased number of pins.

According to the present invention, a single-layer wiring tape to which a chip is electrically connected by means of inner bump bonding (IBB) is adhered to a printed circuit board including a GND plane and a power plane. Wiring patterns of the wiring tape connected to a power electrode on the chip and a GND electrode on the chip, are first connected to the GND plane and the power plane by means of inner bump bonding, and then further connected through the GND plane and the power plane, to an external power terminal on the wiring tape and an external GND terminal on the wiring tape.

In such a configuration, since a GND layer and a power layer are provided not on the wiring tape but on the printed circuit board which surrounds the chip, wiring of the wiring tape can be specially used for signal wiring. Accordingly, if the signal wiring is arranged at a higher density, it will be possible for the device to be adaptable to an increase in the number of pins. Conversely, if wiring pitches are made larger, it is possible to reduce costs of the wiring tape and noises.

Also, if large GND and power layers are separated, mutual impedance can be reduced.

Furthermore, the printed circuit board is less expensive because it is of simple structure which includes only GND and power planes without any high-density signal wiring. The connection between the printed circuit board and the wiring tape can also be made with ease by employing the same IBB method as the connection between the printed circuit board and the electrode on the chip. Thus, costs can be reduced remarkably over the case in the multilayer wiring tape.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1A:
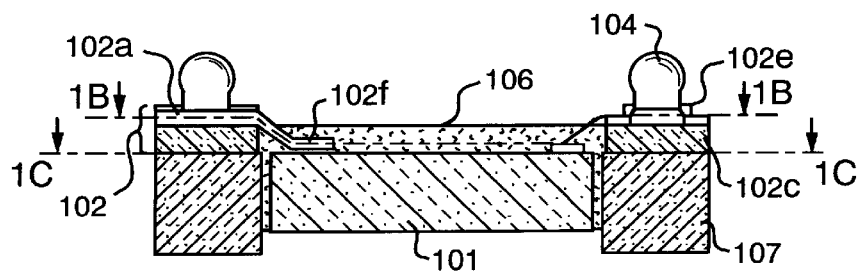
FIGS. 1A to 1C are views showing a conventional semiconductor device disclosed in Japanese Patent Laid-Open No.55447/1997.
Figure 1B:
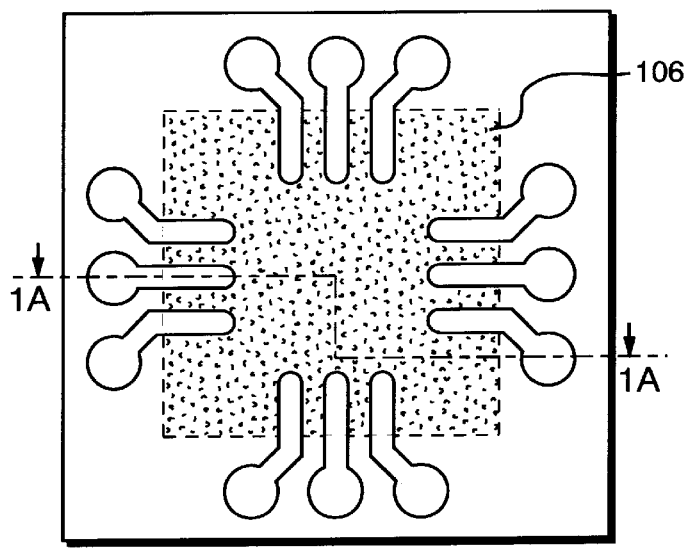
Figure 1C:
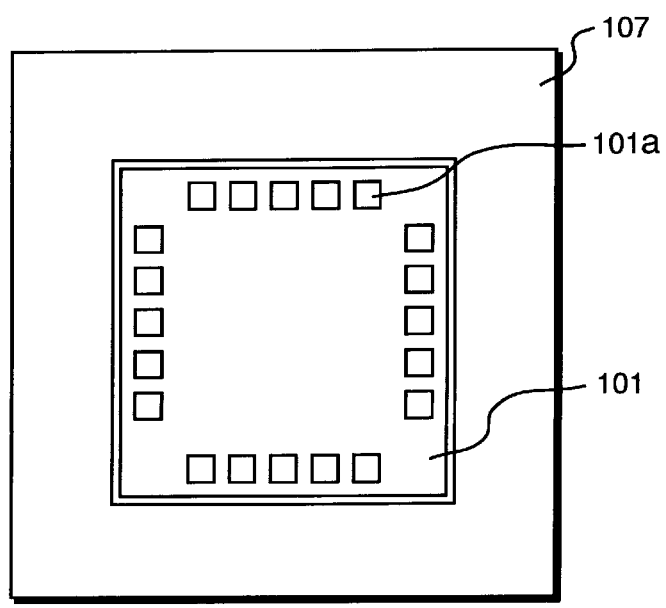
Figure 2A:
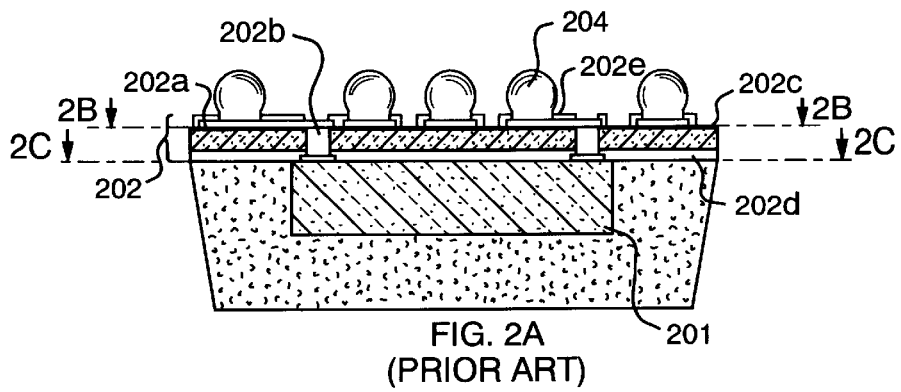
FIGS. 2A to 2C are views showing another conventional semiconductor device.
Figure 2B:
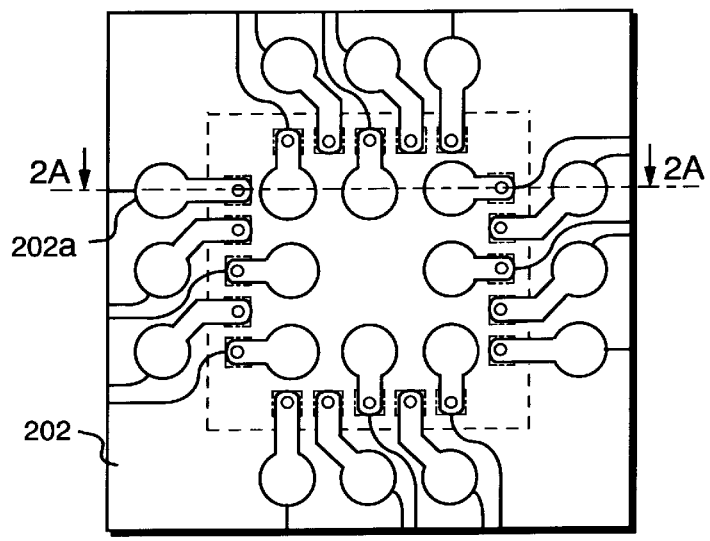
Figure 2C:
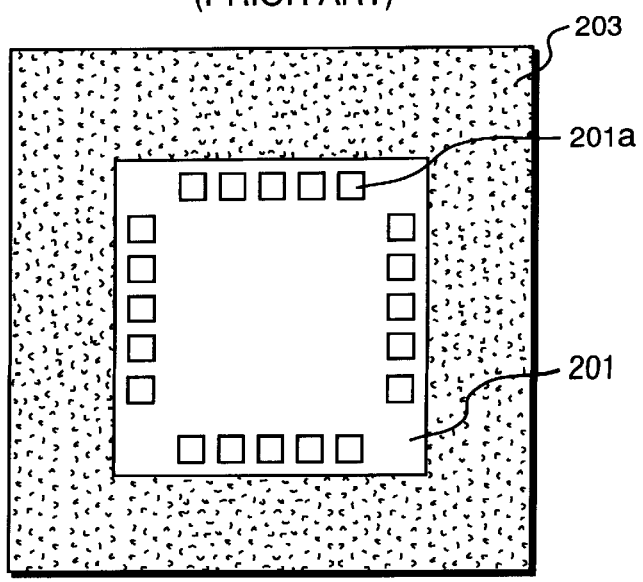
Figure 3A:
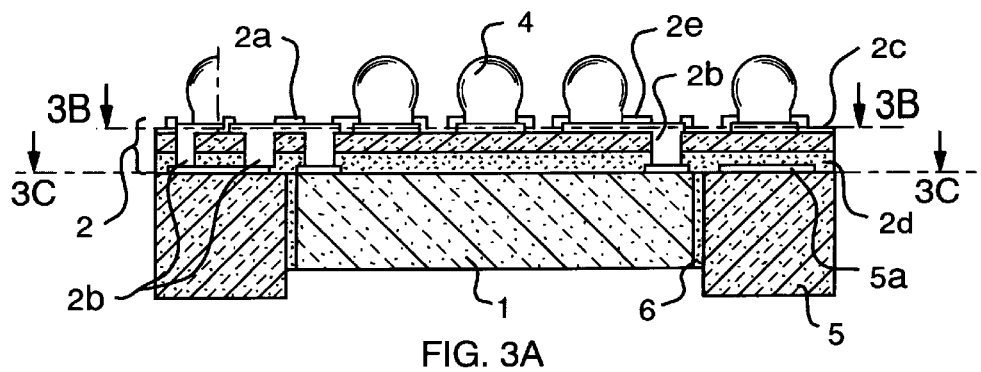
FIGS. 3A to 3C are views showing a semiconductor device according to an embodiment of the present invention.
Figure 3B:
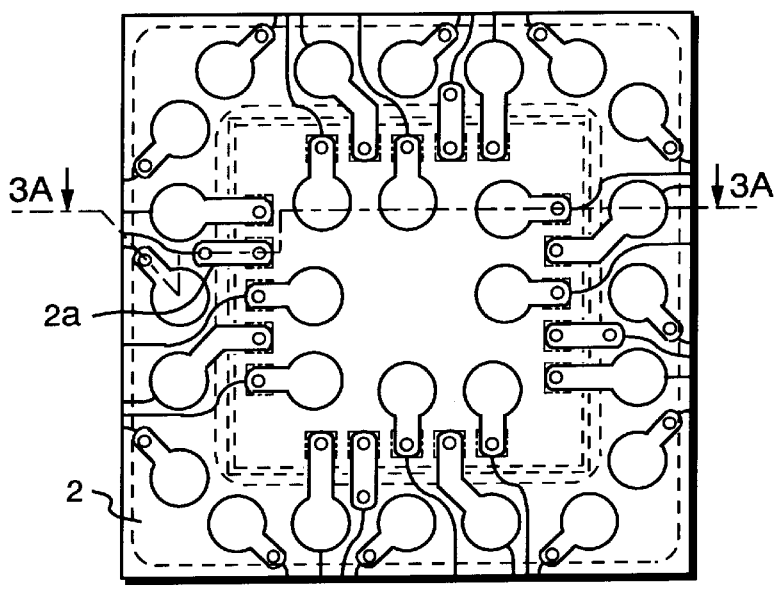
Figure 3C:
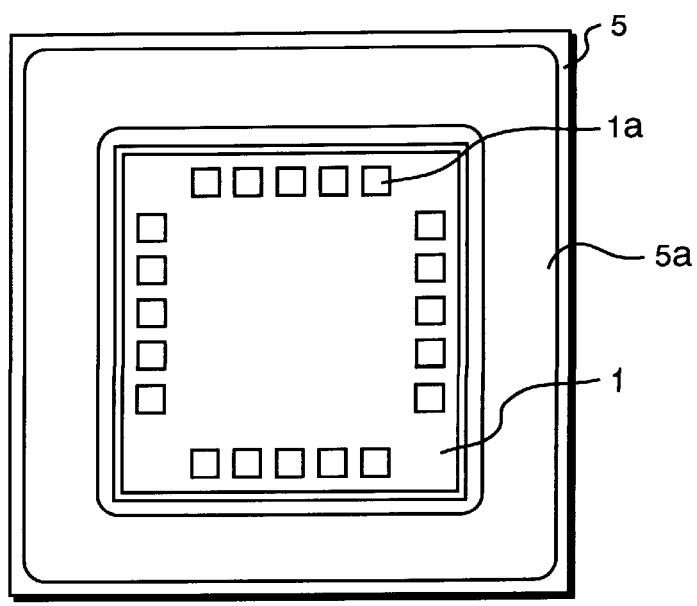

Referring to FIGS. 3A to 3C, there is shown a semiconductor device according to an embodiment of the present invention. The semiconductor device comprises single-layer wiring tape 2 to which a chip 1 is connected, and a printed circuit board 5 which is a frame member to surround a side face of chip 1, the printed board being connected to wiring tape 2. Printed circuit board 5 is a board made of, for example, a glass epoxy resin, with a planar metal pattern 5a as a GND plane or a power plane on either surface thereof.

Wiring tape 2 consists of an adhesive material 2d, a base substrate 2c, a circuit pattern 2a and a cover resist 2e. Adhesive material 2d is provided on one surface of base substrate 2c, and adhered to chip 1 and printed circuit board 5. Through holes 2b are provided on base substrate 2c and adhesive material 2d, registering against an electrode 1a on chip 1 and a planar metal pattern 5a on printed circuit board 5. The interior of each through hole 2b is filled with metal material. Each through hole 2b is connected to electrode 1a on chip 1 or planar metal pattern 5a on printed circuit board 5 by employing an IBB (Inner Bump Bonding) method. A circuit pattern 2a is provided on the other surface (surface opposite to adhesive sealing material 2) of base material 2c.

Circuit patterns 2a are formed from through hole 2b connected to either an power electrode or GND electrode on chip 1 to through hole 2b connected to planar metal pattern 5a on printed circuit board 5, from through hole 2b connected to planar metal pattern 5a on printed circuit board 5 to a pad for a desired external terminal 4, and from through hole 2b connected to a signal electrode on chip 1 to the pad for a desired external terminal 4 (see FIGS. 3A and 3B). Circuit pattern 2a is covered with a cover resist 2e except a pad to which external terminal (e.g., solder ball) 4 is connected and a portion just above through hole 2b. Also, chip 1 are covered with a potting resins 6.

Next, a method of manufacturing the semiconductor device according to the embodiment will be described with reference to FIGS. 4A to 4F.

Figure 4A:
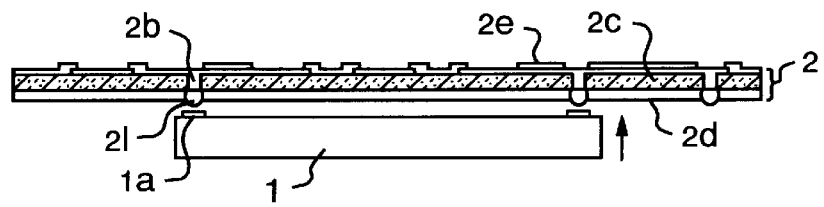
FIGS. 4A to 4F are views showing an example of a manufacturing process of the semiconductor device of the present invention.

First, as shown in FIG. 4A, a bump 21 provided in through hole 2b of wiring tape 2 is positioned above electrode 1a on chip 1 so as to be aligned with electrode 1a vertically. Then, chip 1 is adhered to adhesive material 2d of wiring tape 2 by means of a hot pressing method.

Figure 4B:
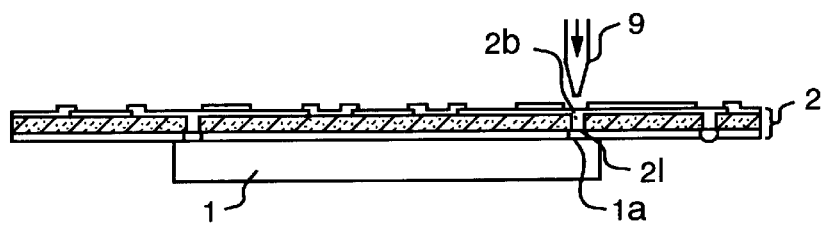

Then, as shown in FIG. 4B, the metal filled in through hole 2b of wiring tape 2 and electrode 1a on chip 1 are connected to each other by means of bonding tool 9, through bump 21.

Figure 4C:
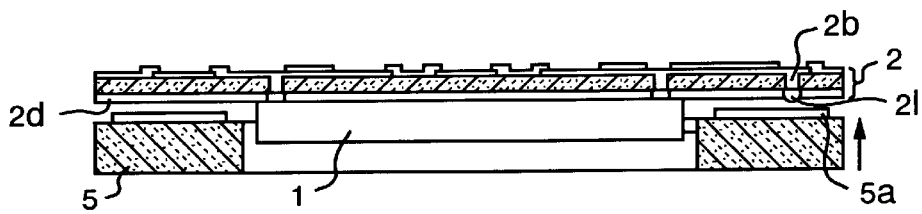

Then, as shown in FIG. 4C, chip 1 is inserted into a window of printed circuit board 5 of a frame configuration. Printed circuit board 5 is then adhered to adhesive material 2d of wiring tape 2 by employing the hot pressing method. At this time, planar metal pattern 5a on printed circuit board 5 comes into contact with bump 21 provided in through hole 2b of wiring tape 2.

Figure 4D:
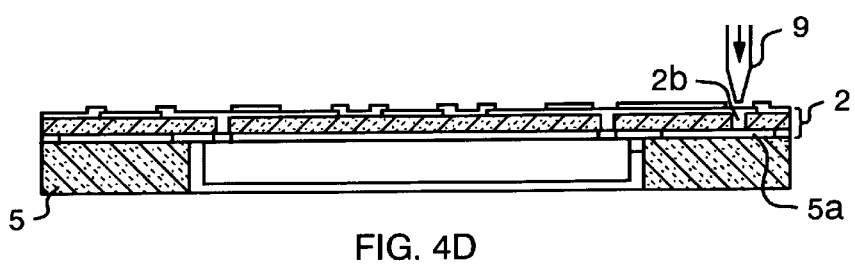

Then, as shown in FIG. 4D, the metal plate filled in through hole 2b of wiring tape 2 and planar metal pattern 5a on printed circuit board 5 are connected to each other by means of bonding tool 9, through bump 21.

Figure 4E:
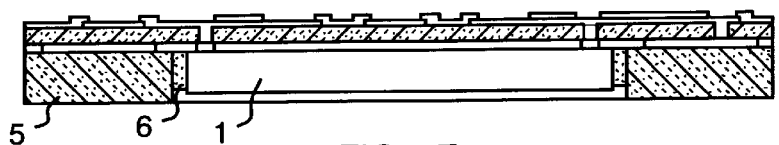

Then, as shown in FIG. 4E, a gap created between chip 1 and printed circuit board 5 is filled with potting resin 6.

Figure 4F:
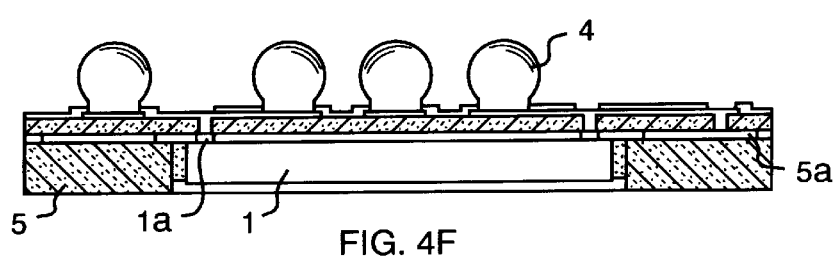

Finally, as shown in FIG. 4F, external terminal (e.g., solder ball) 4 is mounted on a pad connected to electrode 1a on chip1 or planar metal pattern 5a on printed circuit board 5.

In the above described structure, a wiring pattern connected to the power or GND electrode on the chip by means of the IBB method is once connected to the planar metal pattern provided on the printed circuit board surrounding the chip by means of the IBB method, and then connected to the external terminal. On the other hand, a wiring pattern of the wiring tape connected to the signal electrode on the chip by means of the IBB method is directly connected to the external terminal without the planar metal pattern on the printed circuit board interposed therebetween. Consequently, a GND line or a power line is reinforced while using the single-layer wiring tape of less expense, resulting in noise reduction.

Figure 5A:
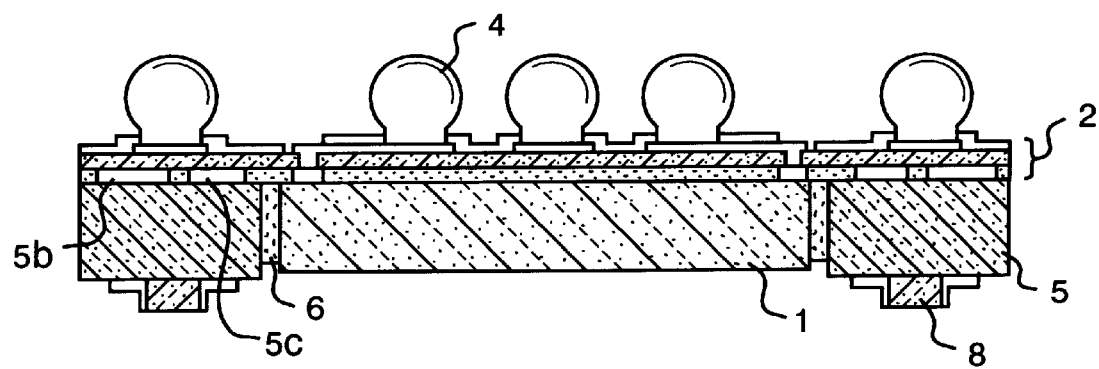
FIGS. 5A and 5B are views showing a semiconductor device according to another embodiment of the present invention.
Figure 5B:
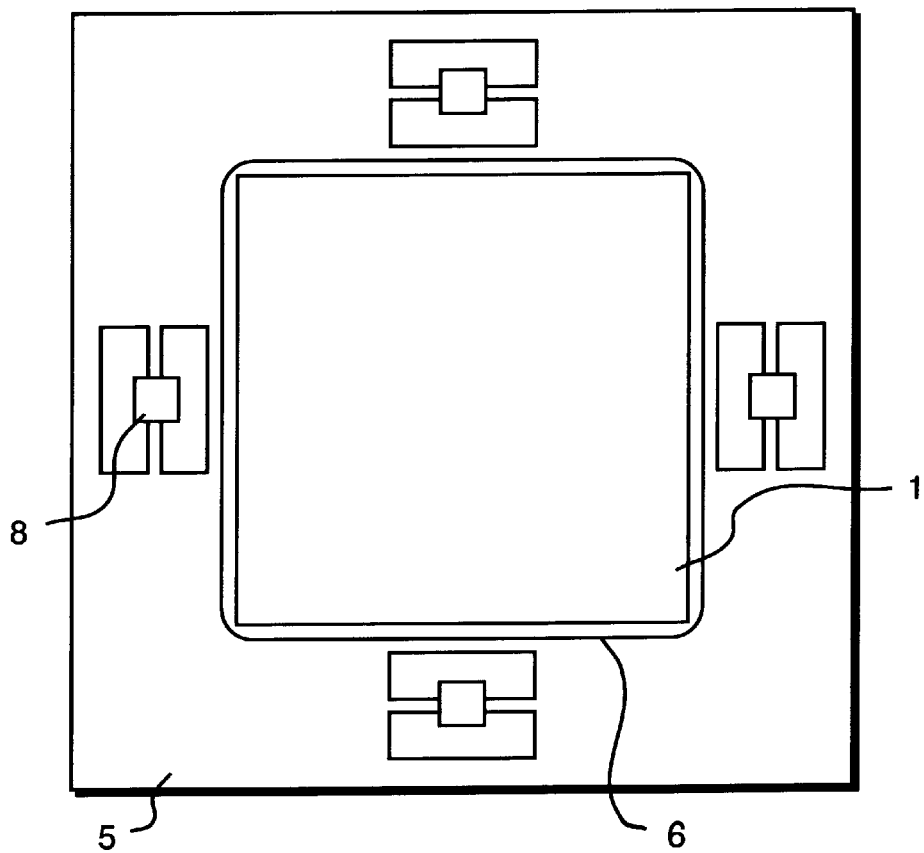

As shown in FIGS. 5A and 5B, the present embodiment has a configuration providing GND plane 5c and power plane 5b on one surface of printed circuit board 5 and a chip capacitor 8 or a chip resistor on the other surface thereof, which enables noise reduction. FIG. 5A is a vertical sectional view of a semiconductor device of this structure, and FIG. 5B is a plan view of the semiconductor device of the same structure as viewed from a chip side. Each of FIGS. 6A to 6C shows a structure of printed circuit board 5 shown in each of FIGs. 5A and 5B.

Figure 6A:
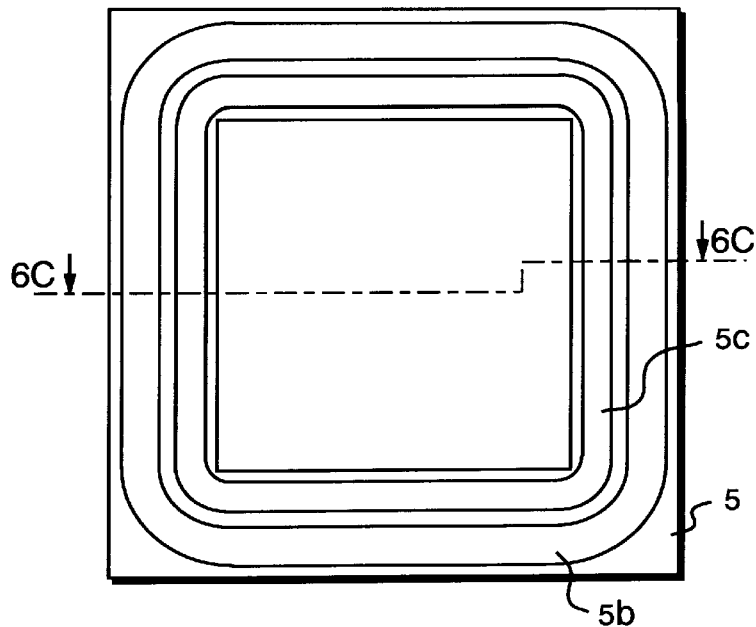
FIGS. 6A to 6C are views showing a structure of the printed circuit board shown in FIGS. 5A and 5B.
Figure 6B:
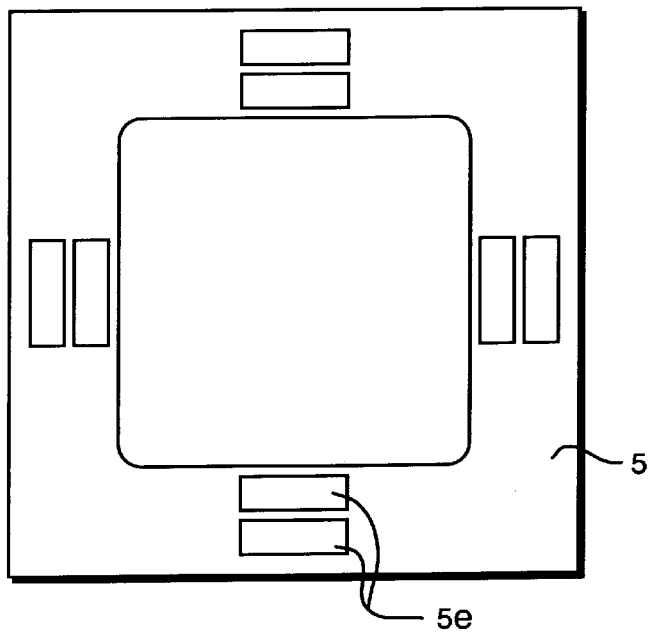
Figure 6C:
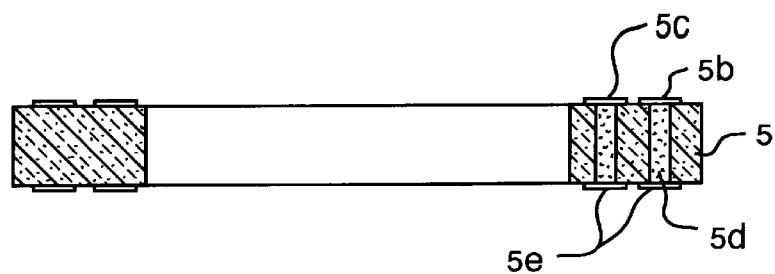

GND plane 5c and power plane 5b are provided in annular form on a surface of printed circuit board 5 facing wiring tape 2, as shown in FIGS. 6A to 6C. A pad 5e for mounting chip capacitor 8 is provided on a surface opposite to the surface connected to wiring tape 2. The pad to which one electrode of chip capacitor 8 is connected is connected to power plane 5b through a via hole 5d. The pad to which the other electrode of chip capacitor 8 is connected is connected to GND plane 5c through a via hole 5d.

Figure 7A:
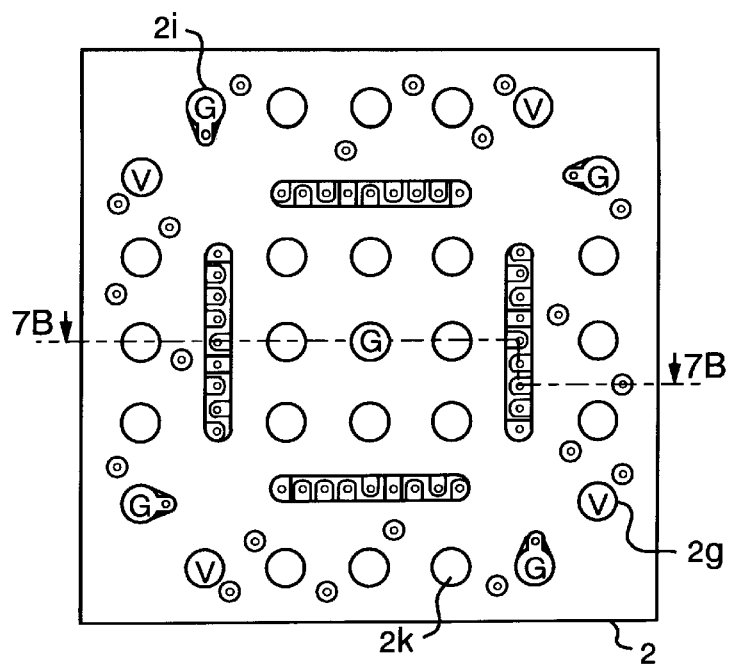
FIGS. 7A to 7C are views showing an example of the wiring tape shown in FIGS. 5A and 5B.
Figure 7B:
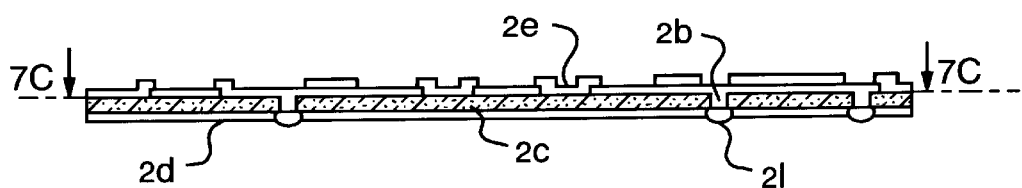
Figure 7C:
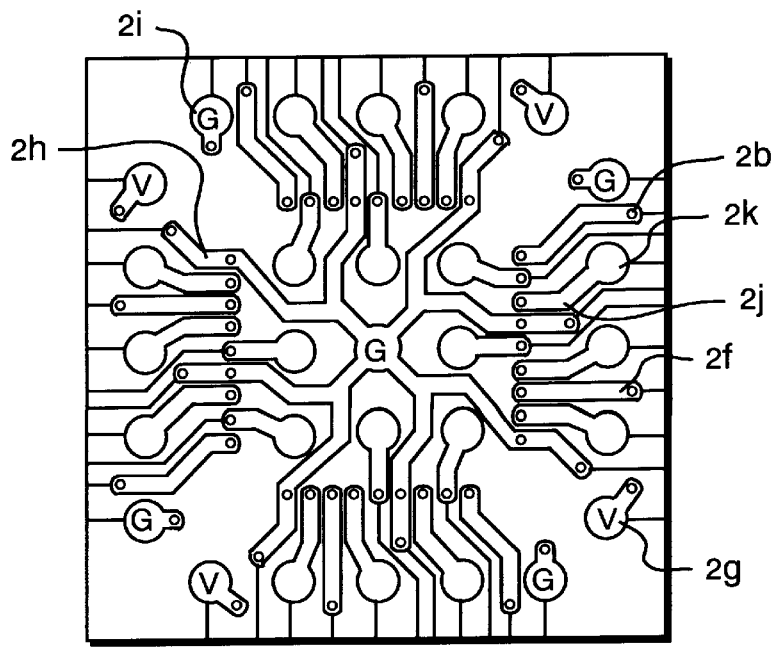

In addition, GND plane 5c and power plane 5b provided on printed circuit board 5 are connected to, for example wiring tape 2 shown in each of FIGS. 7A to 7C, thereby enabling noise reduction. FIG. 7 is a plan view showing an example of the wiring tape shown in FIGS. 5A and 5B as seen from the pad side of the external terminal, FIG. 7B is a sectional view taken along line A–A' of FIG. 7A, and FIG. 7C is a sectional view taken along line B–B' of FIG. 7B.

In this embodiment, wiring pattern 2f of the wiring tape connected to the power electrode on the chip is connected, by using the IBB method, through power plane 5b on printed circuit board 5 to the wiring pattern connected to a pad 2g using the external power terminal. A wiring pattern 2h connected to the GND electrode on the chip is connected, by using the IBB method, through GND plane 5c on printed circuit board 5 to the wiring pattern connected to a pad 2i using the external GND terminal. A wiring pattern 2j connected to the signal electrode on the chip by using the IBB method is directly connected, without power plane 5b or GND plane 5c on printed circuit board 5 interposed therebetween, to a pad 2k using the signal external terminal. One electrode of chip capacitor 8 is connected to power plane 5b, the other electrode of chip capacitor 8 is connected to GND plane 5c.

According to such a constitution, noise can be reduced because the GND line and the power line is reinforced while using the single-layer wiring tape of less expense. Impedance matching can also be carried out based on a value of chip capacitor 8 or the chip resistor.

Figure 8A:
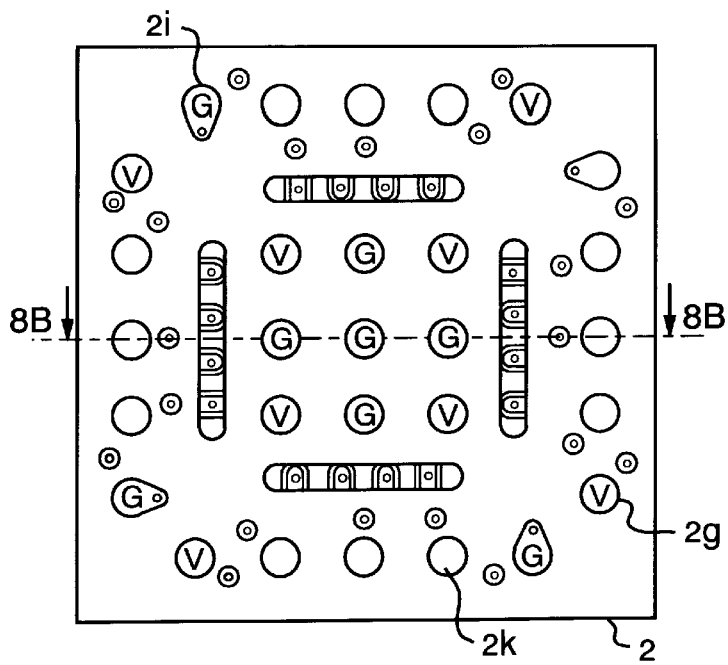
FIGS. 8A to 8C are views showing another example of the wiring tape shown in FIGS. 7A to 7C.
Figure 8B:
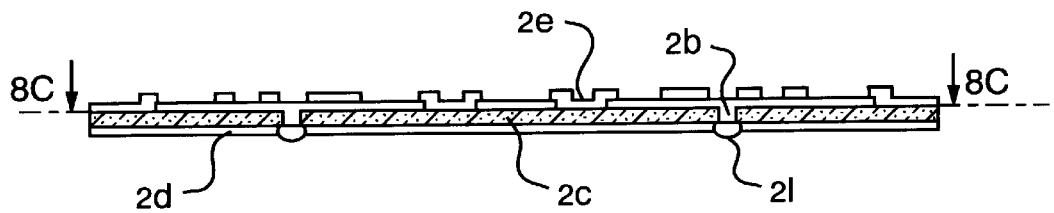
Figure 8C:
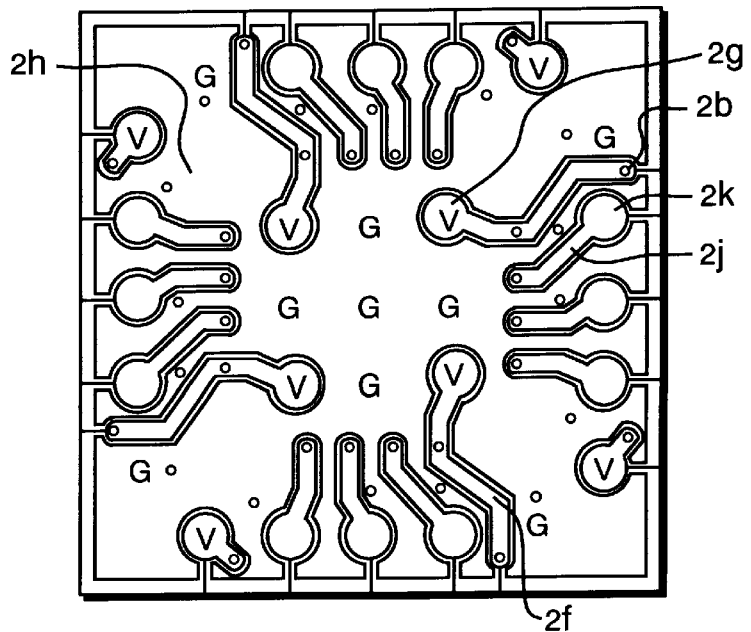

Further reduction of noise is possible by such an arrangement that, as shown in FIGS. 8A to 8C, a GND wiring pattern 2h is made of a planar metal pattern, and a signal wiring pattern 2j is surrounded by GND wiring patterns 2h.

FIG. 8A is a plan view of another example of the wiring pattern shown in FIGS. 7A to 7C as viewed from the pad side of the external terminal, FIG. 8B is a sectional view taken along a line A–A' of FIG. 8A, and FIG. 8C is a sectional view taken along a line B–B' of FIG. 8B. This constitution enables noise reduction on a signal line because signal wiring pattern 2j is electrically shielded.

Figure 9A:
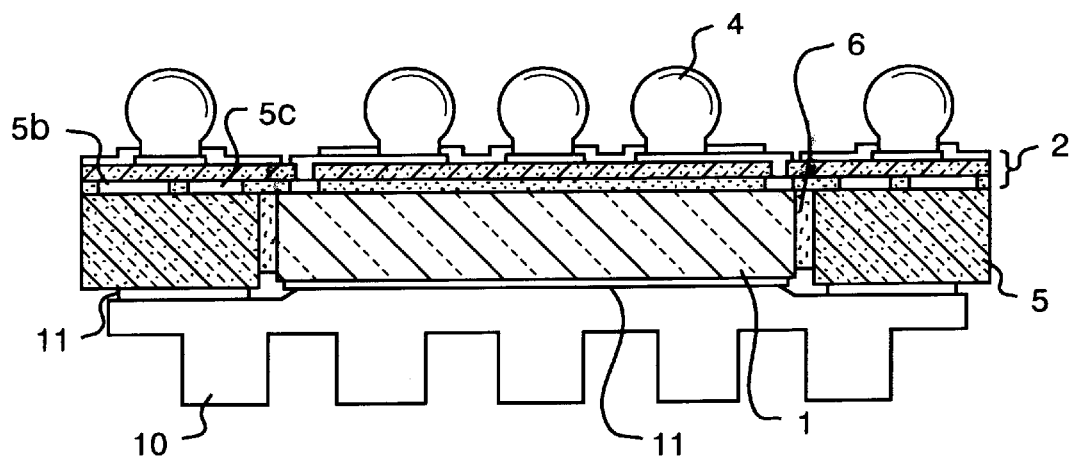
FIGS. 9A and 9B are views showing a semiconductor device according to yet another embodiment of the present invention.
Figure 9B:
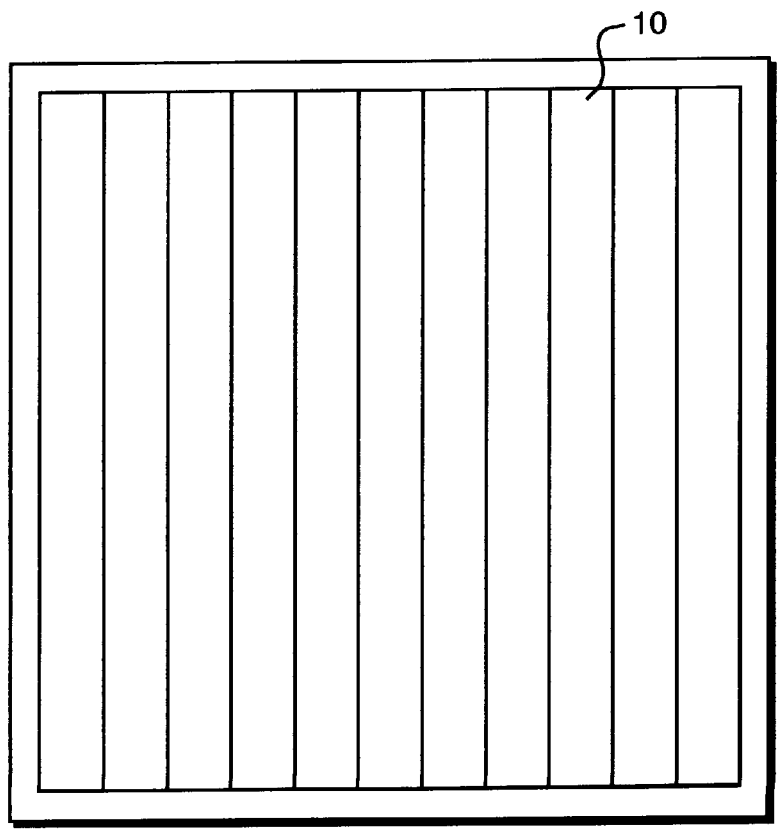

Furthermore, according to the present invention, heat radiation characteristics can also be improved by adhering heat sink 10 to the chip and printed circuit board 5 by means of an adhesive material 11, as shown in FIGS. 9A and 9B.

While a preferred embodiment of the present invention has been described using specific terms, such description is for illustrative purpose only, and it is to be understood that changes and variations may be made without departing from the spirit or scope of the following claims.

What is claimed is:

1. A semiconductor device comprising:
   a single-layer wiring tape including a plurality of external terminals disposed upon one surface thereof and an integrated circuit element adhered to the other surface thereof;
   a printed circuit board having a planar metal pattern, and serving as a frame member adhered to said wiring tape to surround at least a side face of said integrated circuit element; and
   wiring patterns disposed upon said wiring tape being formed to connect at least one of either a power electrode or a ground electrode on said integrated circuit element to said planar metal pattern of the printed circuit board, and to connect said planar metal pattern of the printed circuit board to respectively at least one of either an external power terminal or an external ground terminal on said wiring tape; and
   said wiring patterns of said wiring tape further connecting a signal electrode on said integrated circuit to an external signal terminal of said plurality of external terminals on said wiring tape.

2. A semiconductor device according to claim 1, wherein a heat sink is adhered to said integrated circuit element and said printed circuit board.

3. A semiconductor device according to claim 1, wherein said wiring patterns of the wiring tape are connected to electrodes on said integrated circuit element and said planar metal pattern of the printed circuit board by means of inner bump bonding.

4. A semiconductor device according to claim 3, wherein a heat sink is adhered to said integrated circuit element and said printed circuit board.

5. A semiconductor device comprising:
   a single-layer wiring tape including a plurality of external terminals disposed upon one surface and an integrated circuit element adhered to the other surface;
   a printed circuit board having at least a power plane and a ground plane, and serving as a frame member adhered to said wiring tape to surround at least a side face of said integrated circuit element; and
   wiring patterns disposed upon said wiring tape being formed to connect at least a power electrode on said integrated circuit element to said power plane of the printed circuit board, and from said power plane to an external power terminal on said wiring tape;
   said wiring pattern of said wiring tape further being formed to connect at least a ground electrode on said integrated circuit element to said ground plane of said printed circuit board, and from said ground plane of the printed circuit board to an external ground terminal on said wiring tape; and
   said wiring patterns of said wiring tape further connecting a signal electrode on said integrated circuit to an external signal terminal of said plurality of external terminals on said wiring tape.

6. A semiconductor device according to claim 5, wherein a heat sink is adhered to said integrated circuit element and said printed circuit board.

7. A semiconductor device according to claim 5, wherein said wiring patterns of the wiring tape are connected to electrodes on said integrated circuit element, said power plane of said printed circuit board and said ground plane of said printed circuit board by means of inner bump bonding.

8. A semiconductor device according to claim 7, wherein a head sink is adhered to said integrated circuit element and said printed circuit board.

9. A semiconductor device according to claim 5, wherein a pair of pads are provided on a surface of said printed circuit board for mounting either a chip capacitor or a chip resistor, one of said pair of pads is electrically connected to said power plane, and the other of said pair of pads is electrically connected to said ground plane.

10. A semiconductor device according to claim 9, wherein a heat sink is adhered to said integrated circuit element and said printed circuit board.

11. A semiconductor device according to claim 5, wherein a selected wiring pattern of said plurality of wiring patterns disposed upon said wiring tape which is formed from said signal electrode on said integrated circuit element to said external signal terminal on said wiring tape is surrounded by planar metal patterns, said planar metal patterns further comprising wiring patterns of said wiring tape which are formed from said ground electrode on said integrated circuit element to said ground plane of said printed circuit board, and from said ground plane of said printed circuit board to said external ground terminal on said wiring tape.

12. A semiconductor device according to claim 11, wherein a heat sink is adhered to said integrated circuit element and said printed circuit board.

* * * * *